United States Patent [19]

Shepherd

[11] Patent Number: 4,982,309

[45] Date of Patent: Jan. 1, 1991

[54] ELECTRODES FOR ELECTRICAL CERAMIC OXIDE DEVICES

[75] Inventor: William H. Shepherd, Mt. View, Calif.

[73] Assignee: National Semiconductor Corporation, Santa Clara, Calif.

[21] Appl. No.: 380,942

[22] Filed: Jul. 17, 1989

[51] Int. Cl.⁵ .................. H01G 4/10; H01G 7/00; C23F 7/00
[52] U.S. Cl. .................. 361/321; 29/25.42; 428/338
[58] Field of Search .............. 361/320, 321, 303, 304, 361/305, 306; 428/338; 264/61; 204/252; 29/25.42

[56] References Cited

U.S. PATENT DOCUMENTS

| | | | |
|---|---|---|---|
| 3,320,500 | 5/1967 | Axelrod et al. | 361/305 |
| 3,504,244 | 3/1970 | Chiba et al. | 29/25.42 X |
| 4,050,956 | 9/1977 | Bruin et al. | 428/338 |
| 4,460,622 | 7/1984 | Yamaoka et al. | 361/320 X |
| 4,771,364 | 9/1988 | Kaneko et al. | 361/321 |
| 4,872,086 | 10/1989 | Huang et al. | 361/321 |

*Primary Examiner*—Donald A. Griffin
*Attorney, Agent, or Firm*—Rosenblum, Parish & Bacigalupi

[57] ABSTRACT

Electrodes composed of ruthenium, iridium, osmium, or rhodium and the electrically conductive oxides of these metals are particularly well-suited to use in electrical ceramic oxide devices because of the low resistivity of the oxides and the stability of the oxides under the processing conditions necessary to optimize performance of electrical ceramic oxide materials.

18 Claims, 2 Drawing Sheets

ELECTRODES FOR ELECTRICAL CERAMIC OXIDE DEVICES

BACKGROUND OF THE INVENTION

1. Field of the Invention

This invention relates to electrical ceramic oxide devices. More specifically, it relates to electrical ceramic oxide devices having electrodes composed of ruthenium, iridium, osmium, or rhodium and the electrically conductive oxides of those metals. These electrodes make excellent contacts to electrical ceramic oxides, such as those used for ferroelectric capacitors for microelectronic memories, high temperature superconductors, and electrooptic devices.

2. Description of the Prior Art

Ruthenium has previously been used as an electrode material in electrolytic cells, as discussed in Thomas et al. (U.S. Pat. No. 4,507,183). Microelectronic applications of ruthenium, osmium, rhodium, and iridium as conductors and resistors are taught by Shibasaki (U.S. Pat. No. 4,227,039) and Schnable (U.S. Statutory Invention Reg. No. H546). Yoshida et al. recognized that because of their low resistivity the oxides of ruthenium, rhodium, palladium, rhenium, osmium, and iridium could function as cathode collectors in a solid electrolyte capacitor (U.S. Pat. No. 4,184,192). Yoshida et al. also disclosed that because of their resistivity and oxidizing power, the oxides of ruthenium, rhodium, rhenium, osmium, and iridium used as the electrolyte improved the performance of solid electrolyte capacitors (U.S. Pat. No. 4,186,423).

Recently, ruthenium oxide's electrical conductivity has led to its investigation as a reaction barrier between silicon and aluminum in integrated circuits. As a reaction barrier, it prevents degradation of electrical contacts caused by the solubility and diffusivity of silicon in aluminum. See Kolwa et al., "Microstructure of Reactively Sputtered Oxide Diffusion Barriers," 17 *J. Elect. Materials* 425 (1988); Krusin-Elbaum et al., "Characterization of Reactively Sputtered Ruthenium Dioxide for Very Large Scale Integrated Metallization," 50 *Appl. Phys. Lett.* 1879 (1987). The excellent adhesion of ruthenium oxide to silicon and silicon dioxide substrates is noted by Green et al., "Chemical Vapor Deposition of Ruthenium and Ruthenium Dioxide Films," 132 *J. Electrochem. Soc.* 2677 (1985).

A variety of electrical ceramic oxides exist, such as might be or are used as ferroelectric capacitors for microelectronic memories (for example, lead titanate, $PbTiO_3$; lead zirconate titanate, "PZT"; lanthanum doped PZT, "PLZT"; and barium titanate, ($BaTiO_3$)); electro-optic devices (for example, PLZT; lithium niobate, $LiNbO_3$; and bismuth titanate, $Bi_4Ti_3O_{12}$); and high temperature superconductors (for example, yttrium barium copper oxide, $YBa_2Cu_3O_7$). The properties of these electrical ceramic oxides are typically optimized by heat treatments in oxidizing ambients at high temperatures (for example, 500° C. to 1100° C.). Many electrode materials which are commonly used in microelectronics and for other applications are not suitable for use under such conditions. As examples, aluminum melts or reacts with the electrical ceramic oxide material, while tungsten and molybdenum are destructively oxidized; silicides and polysilicon either react with the electrical ceramic oxides at the higher temperatures or are oxidized at the surface in contact with the electrical ceramic oxide.

Moreover, if the oxide of an electrode metal has a high resistivity, reaction of the electrode material with the electrical ceramic oxide will create an interfacial dielectric layer of oxidized electrode material between the electrode and the electrical ceramic oxide. This may give rise to a capacitor in series with the electrical ceramic oxide, reducing the voltage drop experienced across the electrical ceramic oxide. In the application of electrical ceramic oxides as ferroelectric capacitors for microelectronic memories, efficiency of storage is reduced as a result. Since the dielectric constants of ferroelectric capacitor materials are typically more than 10 times the dielectric constants of the nonferroelectric interfacial layers which might be formed, the interfacial layer must be approximately 100 times thinner than the ferroelectric capacitor if 90% of the voltage applied to the capacitor is to be dropped across the ferroelectric capacitor. Since a thin film ferroelectric capacitor integrated into a microelectronic circuit has a typical thickness of 5000 Å, this requires an interfacial dielectric layer of oxidized electrode material of thickness less than 50 Å (i.e. essentially no oxide). In the use of electrical ceramic oxide devices such as superconductors, the interfacial oxide inhibits ohmic conduction.

Thin ferroelectric ceramic oxide capacitors in integrated circuits or fabricated as test devices and investigated for circuit applications have used noble metals (e.g. platinum, palladium, and gold) as electrode materials in order to eliminate the problem of interfacial dielectric layers composed of the oxides of the electrode materials. However, noble metals have numerous disadvantages, including high cost, poor adhesion to silicon oxides, silicon nitrides, and ceramic oxides, and such high reactivity toward aluminum that the interconnection of capacitors utilizing noble metal electrodes with other circuit elements frequently requires the use of reaction barriers at all points where the aluminum interconnection makes contact to the electrodes of the capacitor.

Indium oxide and indium-tin oxide have also been used as electrode materials for thin film ferroelectric ceramic oxide capacitors. However, these compounds have insufficient conductivity to perform well as electrodes for such capacitors in integrated circuits, where it has always proved desirable to have conductive materials be as conductive as possible so that extended lengths can be used without causing significant voltage drops in the circuit.

SUMMARY OF THE INVENTION

It is an object of this invention to provide electrodes suitable for use with electrical ceramic oxide materials such as ferroelectric capacitors for microelectronic memories, high temperature superconductors, and electro-optic devices. The electrodes must be stable electrically and functionally under the high temperature oxidizing conditions needed to optimize the characteristics of the electrical ceramic oxide materials.

It is another object of this invention to provide electrodes for electrical ceramic oxide materials which exhibit high conductivity at moderate cost, and which maintain such conductivity in the oxide form of the electrode material.

It is still another object of the invention to provide an electrode which makes good electrical and physical contact to aluminum and silicon at temperatures up to 550 C.

A further object of this invention is to provide an electrode with excellent adhesion to surfaces commonly encountered in microelectronics, such as the oxides and nitrides of silicon, and to electrical ceramic oxides.

These and related objects may be achieved through the use of an electrical ceramic oxide device having an interfacing electrode connecting electrical ceramic oxide material to common electrical lead materials, where the interfacing electrode has the characteristic that it does not harmfully react with the electrical oxide ceramic material. This invention utilizes an interfacing electrode that includes a body of material selected from the group consisting of ruthenium, iridium, osmium, rhodium, and the oxides of these metals, all of which are good electrical conductors.

A further embodiment of this invention uses an interfacing electrode including two bodies of material, in which the first body of material is selected from the group consisting of ruthenium oxide, iridium oxide, osmium oxide, and rhodium oxide, and further including a second body of material selected from the group consisting of ruthenium, iridium, osmium, and rhodium, where the second body of material is disposed between the electrical lead material and the first body of material. This second body prevents formation of an interfacial oxide layer between the electrical lead material and first body of material.

This invention provides electrodes for electrical ceramic oxide devices exhibiting excellent electrical and physical stability at high temperature, high conductivity even in the oxide form, moderate cost, good contact to aluminum, low contact resistance to aluminum, and excellent adhesion to microelectronic materials.

The attainment of the foregoing and related objects, advantages and features of the invention should be more readily apparent to those skilled in the art after review of the following more detailed description of the invention.

DETAILED DESCRIPTION OF THE PREFERRED EMBODIMENTS

This invention uses the physical properties of the chemically similar metals ruthenium, iridium, osmium, and rhodium and their oxides to create electrodes for electrical ceramic oxide devices. As Table 1 shows, these metals and their oxides are very good electrical conductors.

TABLE 1

| | Electrical Resistivity | |
|---|---|---|
| | Metal (micro-ohm cm) | Oxide (micro-ohm cm) |
| Ru | 7.7 | $RuO_2$ 45 |
| Rh | 4.5 | $RhO_2$ <100 |
| Ir | 5.3 | $IrO_2$ <100 |
| Os | 9.5 | $OsO_2$ <100 |
| Pt | 10.6 | |

TABLE 1-continued

| | Electrical Resistivity | |
|---|---|---|
| | Metal (micro-ohm cm) | Oxide (micro-ohm cm) |
| Polysilicon | about 1000 | |

For example, ruthenium has a resistivity of about 8 micro-ohm cm, which is better than platinum (with a value of 11 micro-ohm cm). Ruthenium oxide has a resistivity of about 45 micro-ohm cm, which is only four times worse than platinum while being more than 20 times better than polysilicon.

Moreover, these oxides are stable over a wide temperature range. Ruthenium oxide is stable in oxygen to at least 900 C. for periods up to several hours. Thus, these oxides are particularly well-suited for use with electrical ceramic oxide materials whose performance is optimized at high temperatures in an oxidizing environment.

In addition, ruthenium has been shown to be stable in contact with both aluminum and silicon to 550 C. Ruthenium also makes good electrical contact to silicon and to aluminum. These characteristics are ideal for interconnecting capacitors with ruthenium or ruthenium oxide electrodes into microelectronic circuits with a minimum of difficulty using conventional processing technology.

Ruthenium and ruthenium oxide also exhibit good adherence to silicon, silicon dioxide, and to ceramic oxides without the need for adhesion promoters, such as those required when using platinum. Ruthenium is also less costly than platinum, palladium, and gold, which have previously been used as electrode materials for electrical ceramic oxide materials.

Figure 1:
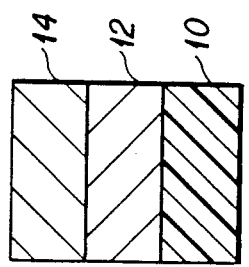

FIG. 1 shows a schematic representation of an electrical ceramic oxide device according to the invention. An electrical ceramic oxide material 10 is connected to a common electrical conductive lead means 14 (such as aluminum) by a body of electrically conducting interfacing material 12 consisting of ruthenium, iridium, osmium, rhodium, or an oxide of these materials, or a mixture thereof. The oxides are chemically stable to the electrical ceramic oxide material. If metals alone are used, they are believed to form an oxide of the metal at the interface of the electrical ceramic oxide and the metal.

The body of interfacing material 12 preferably is created either (a) by deposition of ruthenium, iridium, osmium or rhodium metal on the ceramic oxide material 10 prior to heating to optimize the characteristics of the ceramic oxide material, in which case the metal may be converted to the oxide upon heating with oxygen, or (b) by direct deposition of the metal oxide on the ceramic material. Alternatively, if the metal alone is deposited on the electrical ceramic oxide material and is not converted to oxide (for example, by heating with oxygen), the interfacing material remains as the metal with what is believed to be the formation of some metal oxide at the interface of the electrical ceramic oxide material and the metal.

At this point the conventional lead means 14 may be attached. However, if the interfacing material 12 is in the oxide form (for example, ruthenium oxide) and during subsequent processing the device is heated to a sufficiently high temperature (for example, 450 C.), a poor electrical contact may result between the interfacing material and the lead means. Such high temperatures may occur in processing unrelated to the formation of the electrode. For example, in conventional semiconductor processing, temperatures of 400° C. to 450° C. may be used for alloying, dielectric deposition, or packaging and die attachment. The reason that a poor contact may result from such temperatures is described below.

When an easily reducible oxide such as ruthenium oxide is heated in contact with a strongly reducing element or compound (such as aluminum, silicon, or titanium silicide) an oxidation-reduction reaction may take place at the interface if the temperature and time are sufficient. For example, in the case of aluminum and ruthenium oxide, aluminum oxide and ruthenium are created.

$$3\ RuO_2 + 2\ Al \rightarrow 3\ Ru + Al_2O_3$$

The aluminum oxide may form an electrically insulating layer between the ruthenium oxide and the aluminum, giving rise to a poor contact. The rate at which this reaction takes place increases as the temperature and time increase. In a typical alloying procedure involving heating at 400° C. or 450° C. for 30 minutes, sufficient reaction may occur to degrade the electrical characteristics of the contact.

Figure 2:
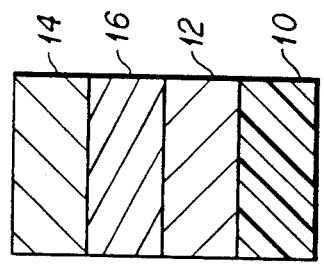
FIG. 1 and FIG. 2 are schematic representations of electrical ceramic oxide devices showing the invention.

This problem can not occur if ruthenium contacts the aluminum, since no oxygen is present for formation of the aluminum oxide. Ruthenium is also stable in contact with its own oxide. Thus, ruthenium can serve as a barrier between ruthenium oxide and aluminum. FIG. 2 shows use of such a configuration in the preferred embodiment for devices subject to high temperature processing after formation of the electrode. The electrical ceramic oxide material 10 contacts a first body of electrically conducting interfacing material 12 consisting of ruthenium oxide (or the oxides of the related metals specified above). A second body of electrically conducting interfacing material 16 consisting of ruthenium (or the related metals specified above) connects the ruthenium oxide to the electrical conductive lead means 14 (such as aluminum).

Figure 3A:
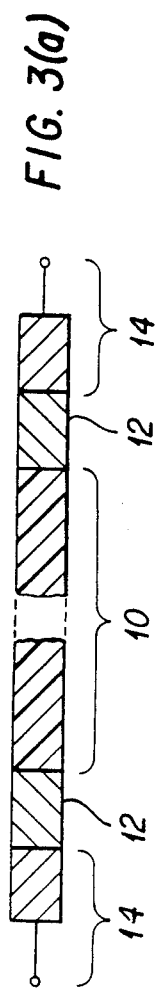
FIGS. 3(a) and 3(b) show electrical circuits using the invention.
Figure 3B:
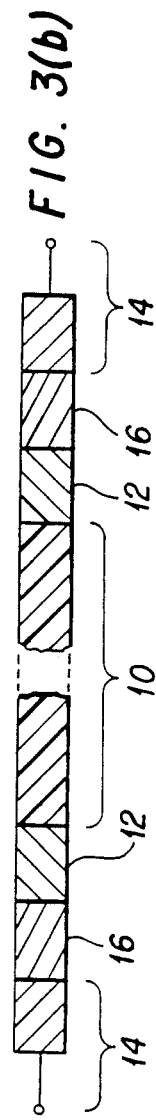

FIGS. 3(a) and 3(b) show an electrical ceramic oxide capacitor using the electrodes shown by FIGS. 1 and 2, respectively, where electrical ceramic oxide material 10 is a ferroelectric ceramic oxide dielectric material. Electro-optic devices and high temperature superconductor devices may be formed by substitution of an appropriate electrical ceramic oxide material 10 in place of the ferroelectric ceramic oxide dielectric.

Figure 4:
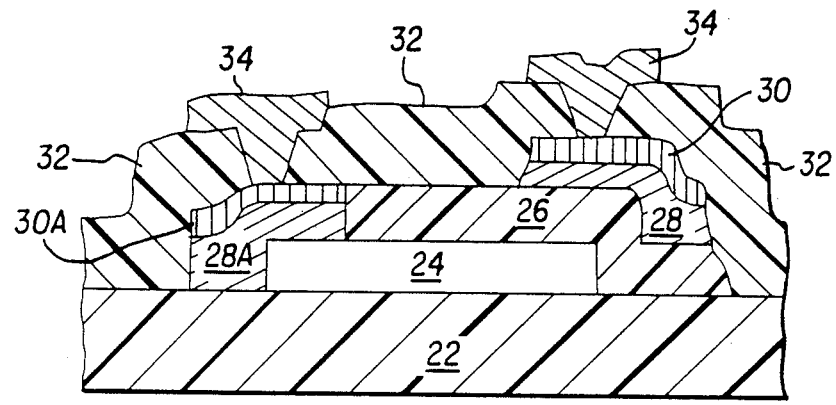
FIG. 4 is a cross-sectional view of a portion of an integrated circuit showing an electrical ceramic oxide capacitor with top and bottom electrodes in accordance with the invention.

With reference to FIG. 4, a specific microelectronic application of the invention is shown. A semiconductor substrate 22, such as a patterned CMOS wafer, supports a body of ruthenium oxide 24 comprising part of the first electrode. This ruthenium oxide body may be formed by depositing a ruthenium film onto the substrate 22 by sputtering or chemical vapor deposition (CVD), and subsequently converting the ruthenium to ruthenium oxide as described below. The ruthenium film thickness is approximately 750 A. Alternatively, a ruthenium oxide film may be reactively sputtered onto the substrate or deposited by chemical vapor deposition. The ruthenium or ruthenium oxide film is patterned by a masking and etching operation.

An electrical ceramic oxide dielectric material 26 is then deposited over the body of ruthenium or ruthenium oxide 24. The electrical ceramic dielectric material is patterned and sintered at 500°-775° C. in oxygen at approximately 1 atmosphere. If ruthenium was deposited as the body 24 above, this process converts the ruthenium or a portion of it to ruthenium oxide, and increases its thickness. If the ruthenium is completely oxidized the thickness increases to approximately 1750 Å. If the oxidation is not complete, the first electrode is now comprised of a body of ruthenium separated from the ceramic oxide by a region of ruthenium oxide the thickness of which is determined by the conditions used to sinter the ceramic oxide material.

A body of ruthenium oxide 28 (comprising part of the second electrode) on the opposite side of the electrical ceramic oxide 26 is created, for example by reactive sputtering of ruthenium oxide, by depositing ruthenium oxide using CVD, or by depositing ruthenium by sputtering or CVD. If ruthenium is deposited, ruthenium oxide may be created by thermal oxidation, for example by heating in oxygen at 650 C. for 15 minutes.

Whichever way the body of ruthenium oxide is formed, it is then covered with a body of metallic ruthenium 30 which will subsequently contact the aluminum (or other conventional conductor) interconnect metallization and prevent interactions between the ruthenium oxide body and the aluminum. A preferred approach is to reactively sputter ruthenium oxide by known techniques using a sputtering ambient comprising, for example, a mixture of argon and oxygen. Then, without removing the wafers from the vacuum chamber a ruthenium body is deposited by sputtering in the absence of oxygen. The composite electrode structure is thus prepared in a single process step. If, on the other hand the ruthenium oxide body was formed by oxidation of a deposited ruthenium body, the wafers are then processed through an additional deposition of ruthenium.

The material used to make the top composite electrode consisting of ruthenium oxide body 28 and ruthenium body 30 is patterned such that material deposited when the top electrode is made also remains over the region where contact will be made to the bottom electrode, through ruthenium oxide body 28A and ruthenium body 30A. In this way, the ruthenium oxide bodies on both the top and bottom electrodes will be separated and protected from reaction with aluminum by a body of ruthenium.

An insulating dielectric coating 32, such as silicon dioxide, is then deposited over the composite bottom electrode comprised of the ruthenium oxide body (24+28A) and the ruthenium body 30A, the composite top electrode comprised of a ruthenium oxide body 28 and a ruthenium body 30, and electrical ceramic oxide 26. The dielectric coating 32 is etched to expose ruthenium bodies 30A and 30 of the top and bottom composite electrodes, respectively.

Thus, the two bodies of electrode material (ruthenium oxide and ruthenium) together form a bottom electrode (comprised of ruthenium oxide (24+28A) and its ruthenium cap 30A) and a top electrode (comprised of ruthenium oxide 28 and its ruthenium cap 30). Electrical connection of the electrical ceramic oxide capacitor (including the two electrodes and the electrical ceramic oxide dielectric material) to the integrated circuit is made through aluminum connections 34 to the electrodes.

The electrodes composed of ruthenium oxide in contact with the electrical ceramic oxide material and ruthenium in contact with the electrical conductive lead means ensure that both the electrical ceramic oxide material and lead means only contact electrode surfaces with which they are stable.

While ruthenium is less costly than the noble metals previously used for contacts to microelectronic electrical ceramic materials, material costs may be further reduced by using ruthenium or ruthenium oxide as a cap on more conventional conductor materials such as aluminum, titanium, polysilicon, and silicides. For example, first electrode 24 could be replaced with a conventional conductor having a cap comprised of a first body of ruthenium oxide contacting the electrical ceramic oxide material and a second body of ruthenium disposed between a conventional conductor and the ruthenium oxide, acting as a reaction barrier between the ruthenium oxide and the conventional conductor.

Moreover, the invention disclosed above may be used with conventional barrier technologies used in semiconductor manufacturing. If, for reasons not determined by the capacitor technology, the use of a barrier is nonetheless a feature of the semiconductor technology with which integration is occurring, such commonly used barrier materials as titanium, titanium nitride, titanium-tungsten, or tungsten can be used to contact the electrode without adverse effects.

Although the present invention has been described in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. An electrical ceramic oxide device including
   a first body of an electrical ceramic oxide material;
   an electrical conductive lead means; and
   a second body of an interfacing material connecting said first body to said lead means, wherein said second body includes a first portion of material selected from the group consisting of ruthenium oxide, iridium oxide, osmium oxide, and rhodium oxide.

2. An electrical ceramic oxide device as claimed in claim 1, wherein said second body further includes a second portion of material selected from the group consisting of ruthenium, iridium, osmium, and rhodium, said second portion disposed between said lead means and said first portion, whereby said second portion prevents formation of an interfacial oxide layer between said lead means and said first portion.

3. The device of claim 2 where said second portion is a single metal selected from the group consisting of ruthenium, iridium, osmium, and rhodium, and said first portion is the oxide of said second portion.

4. The device of claim 2 where said first portion abuts said electrical ceramic oxide material and said second portion.

5. The device of claim 4 where said second portion is a single metal selected from the group consisting of ruthenium, iridium, osmium, and rhodium, and said first portion is the oxide of said second portion.

6. The device of claim 1 where said first portion abuts said electrical ceramic oxide material.

7. A method for forming an electrical contact to an electrical ceramic oxide material comprising:
   (a) providing an electrical ceramic oxide substrate;
   (b) providing an electrical conductive lead means; and
   (c) electrically connecting said substrate and said lead means using a first body of material selected from the group consisting of ruthenium oxide, iridium oxide, osmium oxide, and rhodium oxide.

8. The method of claim 7 further using a second body of material selected from the group consisting of ruthenium, iridium, osmium, and rhodium, said second body disposed between said first body and second electrical conductive lead means.

9. The method of claim 8, wherein said second body is formed by deposition of material selected from the group consisting of ruthenium, iridium, osmium, and rhodium, and said first body is formed by reactive deposition with oxygen of material selected from the group consisting of ruthenium, iridium, osmium, and rhodium.

10. The method of claim 9, wherein the deposition of the second body and reactive deposition of the first body are completed in a single process step, by preventing oxidation during the deposition of the second body and by promoting oxidation during the reactive deposition of the first body.

11. The method of claim 8, wherein said second body is formed by sputtering of material selected from the group consisting of ruthenium, iridium, osmium, and rhodium, and said first body is formed by reactive sputtering with oxygen of material selected from the group consisting of ruthenium, iridium, osmium, and rhodium.

12. The method of claim 11, wherein the sputtering of material for the second body and reactive sputtering of material for the first body are completed in a single process step, by preventing oxidation during the sputtering of material for the second body and by promoting oxidation during the reactive sputtering of material for the first body.

13. The method of claim 8, wherein said first body is formed by partial oxidation of said second body.

14. The method of claim 8, wherein said second body is formed by partial reduction of said first body.

15. The method of claim 8, wherein said second body is a single metal selected from the group consisting of ruthenium, iridium, osmium, and rhodium, and said first body is the oxide of said second body.

16. The method of claim 8, wherein said first body abuts said electrical ceramic oxide substrate and said second body.

17. The method of claim 16, wherein said second body is a single metal selected from the group consisting of ruthenium, iridium, osmium, and rhodium, and said first body is the oxide of said second body.

18. The method of claim 7, wherein said first body abuts said electrical ceramic oxide substrate.

* * * * *